(12) United States Patent
Kugler et al.

(10) Patent No.: US 7,517,719 B2
(45) Date of Patent: Apr. 14, 2009

(54) METHOD FOR FABRICATING A SEMICONDUCTOR ELEMENT FROM A DISPERSION OF SEMICONDUCTOR PARTICLES

(75) Inventors: Thomas Kugler, Cambridge (GB); Christopher Newsome, Cambridge (GB); David Russel, Cambridge (GB); Shunpu Li, Cambridge (GB)

(73) Assignee: Seiko Epson Corporation, Tokyo (JP)

( * ) Notice: Subject to any disclaimer, the term of this patent is extended or adjusted under 35 U.S.C. 154(b) by 289 days.

(21) Appl. No.: 11/125,138

(22) Filed: May 10, 2005

(65) Prior Publication Data

US 2006/0014365 A1    Jan. 19, 2006

(30) Foreign Application Priority Data

Jul. 19, 2004    (GB) ................................. 0416124.6

(51) Int. Cl.
*H01L 51/40*    (2006.01)
(52) U.S. Cl. ........... 438/99; 257/E51.005; 257/E51.024
(58) Field of Classification Search ................ 427/903, 427/96.1–96.9, 588; 438/99; 257/40, E51.001–E51.052
See application file for complete search history.

(56) References Cited

U.S. PATENT DOCUMENTS

| 5,500,537 | A |   | 3/1996 | Tsumura et al. |
| 5,871,579 | A | * | 2/1999 | Liang et al. ................... 117/68 |
| 6,066,420 | A | * | 5/2000 | Ohtsu et al. ................... 430/31 |
| 6,180,956 | B1| * | 1/2001 | Chondroudis et al. ......... 257/40 |

(Continued)

FOREIGN PATENT DOCUMENTS

EP    0 859 385 A1    8/1998

(Continued)

OTHER PUBLICATIONS

Jian Ye, Hong-Zheng Chen, Mang Wang. "Preparation and Characterization of Chloroindium Phthalocyanine Nanoparticles from Complexation-Mediated Solubilization." J. Mater. Sci. vol. 38 (2003): pp. 4021-4025.*

(Continued)

*Primary Examiner*—Douglas M Menz
*Assistant Examiner*—Matthew W Such
(74) *Attorney, Agent, or Firm*—Oliff & Berridge, PLC

(57) ABSTRACT

Provided is a method for forming a semiconductor element such as film. The method comprises the steps of:
(i) depositing a suspension of particles of a first semiconductor and a solution of a second semiconductor or a precursor thereof on a surface of a substrate such that a mixture comprising the particles of the first semiconductor suspended in a liquid phase comprising the second semiconductor or precursor thereof results thereon; and
(ii) solidifying the mixture to form the semiconductor element comprising particles of the first semiconductor in a matrix of the second semiconductor which electrically connects adjacent particles of the first semiconductor, the first and second semiconductors being of the same conductivity type and being formed from either the same or different materials.

Figure 1:
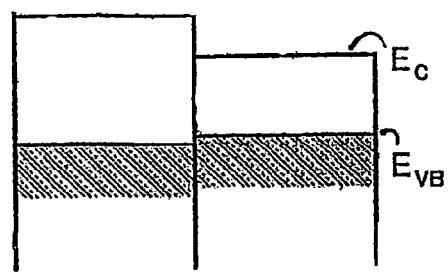

The method does not require any step of vacuum deposition or sintering.

Also provided is a semiconductor element itself. The element comprises semiconductor particles in a matrix of a semiconductor binder that has the same conductivity type as the semiconductor particles and which is the same or a different material than that forming the particles, the semiconductor binder electrically connecting adjacent semiconductor particles.

11 Claims, 1 Drawing Sheet

P3HT    Pentacene

U.S. PATENT DOCUMENTS

| | | | |
|---|---|---|---|
| 6,429,318 B1* | 8/2002 | Mitzi | 549/3 |
| 6,690,029 B1* | 2/2004 | Anthony et al. | 257/40 |
| 6,905,667 B1* | 6/2005 | Chen et al. | 423/447.1 |
| 6,910,933 B1* | 6/2005 | Matsuo et al. | 445/24 |
| 6,963,080 B2* | 11/2005 | Afzali-Ardakani et al. | 257/40 |
| 7,051,945 B2* | 5/2006 | Empedocles et al. | 235/492 |
| 7,057,206 B2 | 6/2006 | Halik et al. | |
| 7,081,210 B2 | 7/2006 | Hirai et al. | |
| 7,115,900 B2* | 10/2006 | Aizenberg et al. | 257/40 |
| 2002/0122765 A1 | 9/2002 | Horiuchi et al. | |
| 2003/0015960 A1* | 1/2003 | Seo et al. | 313/504 |
| 2003/0085397 A1* | 5/2003 | Geens et al. | 257/40 |
| 2003/0226996 A1* | 12/2003 | Aramaki et al. | 252/62.3 Q |
| 2004/0077122 A1* | 4/2004 | Wu et al. | 438/99 |
| 2004/0113145 A1 | 6/2004 | Heeger et al. | |
| 2004/0183070 A1* | 9/2004 | Afzali-Ardakani et al. | 257/40 |
| 2004/0192042 A1* | 9/2004 | Sirringhaus et al. | 438/689 |
| 2004/0241900 A1* | 12/2004 | Tsukamoto et al. | 438/82 |
| 2005/0009229 A1* | 1/2005 | Mitzi | 438/95 |
| 2005/0056828 A1 | 3/2005 | Wada et al. | |
| 2005/0056969 A1* | 3/2005 | Ghosh et al. | 264/442 |
| 2005/0067638 A1* | 3/2005 | Gupta et al. | 257/290 |
| 2005/0221530 A1* | 10/2005 | Cheng et al. | 438/82 |
| 2005/0236614 A1* | 10/2005 | Parker | 257/40 |
| 2006/0006378 A1* | 1/2006 | Hirai | 257/40 |
| 2006/0024860 A1 | 2/2006 | Wada et al. | |
| 2006/0060839 A1* | 3/2006 | Chandross et al. | 257/40 |
| 2006/0099732 A1* | 5/2006 | Miura et al. | 438/99 |
| 2006/0214252 A1 | 9/2006 | Hirai et al. | |

FOREIGN PATENT DOCUMENTS

| | | |
|---|---|---|
| EP | 1020881 | 7/2000 |
| EP | 1182244 A1 * | 2/2002 |
| JP | A 3-255669 | 11/1991 |
| JP | A 2001-036110 | 2/2001 |
| JP | A 2002-313444 | 10/2002 |
| JP | A 2004-88090 | 3/2004 |
| WO | WO 0126425 A1 * | 4/2001 |
| WO | WO03/029354 * | 4/2003 |
| WO | WO 03/089515 A1 | 10/2003 |
| WO | WO 03/094257 A1 | 11/2003 |

OTHER PUBLICATIONS

Joseph Shinar, ed. Organic Light Emitting Devices: A Survey. Springer-Verlag Press: New York (2004): p. 15.*

Bredas, J.L., et al. "Organic Semiconductors: A Theoretical Characterization of the Basic Parameters Governing Charge Transport." Proc. Nat. Acad. Sci. USA., vol. 99, No. 9 (Apr. 30, 2002): pp. 5804-5809.*

Neuteboom, E.E., et al. "Singlet-Energy Transfer In Quadruple Hydrogen-Bonded Oligo(p-phenylenevinylene)perylene-diimide Dyads." Org. Biomol. Chem., vol. 1 (2002): pp. 198-203.*

Cremer, J., et al. "Dye-Functionalized Head-To-Tail Coupled Oligo(3-hexylthiophenes)-perylene-oligothiophene Dyads for Photovoltaic Applications." Org. Biomol. Chem., vol. 3 (2005): pp. 985-995.*

Tada K., et al. "Field-Effect Mobility of Molecularly Doped Poly(3-hexylthiophene)." Jpn. J. Appl. Phys., vol. 36, Part 2, No. 6A (1997): pp. L718-L720.*

Geens, W., et al. "Dependence of Field-Effect Hole Mobility of PPV-Based Polymer Films on the SPin-Casting Solvent." Org. Elect., vol. 3 (2002): pp. 105-110.*

Geens, W., et al. "Modelling the Short-Circuit of Polymer Bulk Heterojunction Solar Cells." Thin Solid Films, vol. 451-452 (Mar. 22, 2004): pp. 498-502.*

Martens, T., et al. "Disclosure of the Nanostructure of MDMO-PPV:PCBM Bulk Hetero-junction Organic Solar Cells by a Combination of SPM and TEM." Synth. Met., vol. 138 (2003): pp. 243-247.*

Mezzenga, R., et al. "Templating Organic Semiconductors Via Self-Assembly of Polymer Colloids." Science, vol. 299 (Mar. 21, 2003): pp. 1872-1874.*

Ridley et al; "All-Inorganic Field Effect Transistors Fabricated by Printing"; Research Articles; vol. 286; Oct. 22, 1999; pp. 746-749; www.sciencemag.org.

* cited by examiner

P3HT     Pentacene

METHOD FOR FABRICATING A SEMICONDUCTOR ELEMENT FROM A DISPERSION OF SEMICONDUCTOR PARTICLES

This invention relates to the fabrication of a semiconductor element, such as a film, from a dispersion of semiconductor particles and particularly to the fabrication of such an element in which the charge carriers have a relatively high mobility.

It is known in the art to manufacture thin film transistors comprising semiconductor films by vacuum depositing a semiconductor material onto a substrate. The intrinsic mobilities of the charge carriers in inorganic semiconductor films formed in this way are as high as 1000 $cm^2/Vs$. Vacuum deposition is however an expensive production technique due to it requiring specialised apparatus and ultra-clean processing conditions. Production techniques requiring simpler apparatus are therefore sought.

There has been major progress recently in the development of solution-processable organic semiconductors. Charge carrier mobilities of up to 0.1 $cm^2/Vs$ have been achieved for films produced by solution depositing such semiconductors. Higher intrinsic charge carrier mobilities of up to 1-2 $cm^2/Vs$ have been obtained for organic thin film transistors formed by vacuum depositing pentacene. Unfortunately, pentacene is not easily solution-processable as it is practically insoluble in all common solvents. Therefore pentacene has so far had to be deposited by vacuum deposition. However, depositing pentacene by this technique is of little commercial interest due to its inherent expense coupled with the fact that the resulting pentacene films cannot achieve charge carrier mobilities comparable to films formed from inorganic semiconductors deposited in the same way.

Derivatives of pentacene are currently being developed which are capable of being deposited from solution. These derivatives have the advantage that they can be deposited as a liquid by spin-coating or by printing technologies such as projection in the form of liquid droplets, i.e. by ink-jet printing. These deposition techniques are much cheaper to carry out than vacuum deposition. It is therefore considered that semiconductors that can be deposited from solution may provide a route to much cheaper methods of fabricating semiconductor elements.

Ink-jet printing techniques are being developed in which the components of a thin film transistor are projected onto a substrate in the form of liquid droplets by means of an adapted ink-jet printing head. B. A. Ridley, B. Nivi and J. M. Jacobson in Science, Vol. 286, pg 746 (1999) describe a process in which a suspension of cadmium selenide nanocrystals is printed on a substrate to form a semiconductor element of a thin film transistor. Inorganic semiconductors such as cadmium selenide cannot be dissolved in any convenient solvent without changing their chemical state and thus compromising their semiconductivity. However, they can be printed as a suspension of nanocrystals, sometimes known as a "colloidal semiconductor". The intrinsic charge carrier mobility of a polycrystalline film of cadmium selenide produced by annealing a film of deposited colloidal cadmium selenide is reported to be about 1 $cm^2/Vs$. Although this mobility is an order of magnitude higher than that of an organic semiconductor film deposited from solution, it is around three orders of magnitude lower than the mobility of charge carriers in a cadmium selenide film formed by vacuum deposition.

The modest intrinsic mobility of the charge carriers of a semiconductor film produced by depositing a suspension of a colloidal semiconductor, in which the particles have an average size of about 2 nm, is not itself sufficient to enable the fabrication of microprocessors and other high performance electronic devices. These devices require higher mobilities. Sintering the nanocrystal film at 250-350° C. for about 30 minutes converts it into a polycrystalline film. The sintering step coalesces the nanocrystals of the colloidal semiconductor into grains of a much larger size, typically 15 nm in diameter.

The mobility of charge carriers through a semiconductor film is hampered by the number of grain boundaries which the charge carriers have to pass through. Therefore the mobility of charge carriers through a sintered polycrystalline film is greater than the mobility through the initially deposited film formed from semiconductor nanocrystals because the charge carriers have to pass through far fewer grain boundaries in the former. However, the step of sintering the colloidal semiconductor film may be destructive of plastic substrates typically used in the preparation of flexible electronic devices as well as any previously prepared components of the electronic devices. As a result, although sintering increases charge carrier mobility, it is nevertheless disadvantageous in most circumstances.

In this specification, the expression "bulk electrical conductance" means the electrical conductance of an element comprising semiconducting particles with or without binder material being present between the particles in contrast to the intrinsic electrical conductance possessed by a single semiconducting particle; the expression "bulk charge carrier mobility" means the mobility of charge carriers in an element comprising semiconducting particles with or without binder material being present between the particles in contrast to the intrinsic mobility of charge carriers in a single semiconducting particle; and the term "matrix" means any relatively fine-grained or amorphous material in which coarser particles are embedded.

It is therefore an object of the present invention to provide a method for fabricating a semiconductor element from a dispersion of semiconductor particles, the element having a bulk charge carrier mobility that is sufficient for it to be suitable for use in microprocessors or other high performance electrical devices without having to subject the element to post-deposition sintering.

According to a first aspect, the present invention provides a method for forming a semiconductor element comprising the steps of:

(i) depositing a suspension of particles of a first semiconductor and a solution of a second semiconductor or a precursor thereof on a surface of a substrate such that a mixture comprising the particles of the first semiconductor suspended in a liquid phase comprising the second semiconductor or precursor thereof results thereon; and (ii) solidifying the mixture to form the semiconductor element comprising particles of the first semiconductor in a matrix of the second semiconductor which electrically connects adjacent particles of the first semiconductor, the first and second semiconductors being of the same conductivity type and being formed from either the same or different materials.

According to this aspect of the present invention, a semiconductor element can be fabricated having a relatively high bulk charge carrier mobility without the need for a vacuum-deposition step or a sintering step whose respective disadvantages have been explained above. A high bulk charge carrier mobility is achieved by embedding the particles of the first semiconductor in the matrix of the second semiconducor which creates electrical connections between adjacent particles of the first semiconductor thus increasing the mobility of the charge carriers in the element.

Preferably the first and second semiconductors are formed from different materials, the first semiconductor having a higher intrinsic charge carrier mobility than the second. This ensures that the bulk charge carrier mobility of the element as a whole is large insofar as the element is predominantly formed from the particles of the first semiconductor which possesses a higher bulk charge carrier mobility than that of the second semiconductor.

The solution of the second semiconductor or precursor thereof may be formed entirely from the semiconductor or its precursor if this is liquid. This can be achieved in some instances by melting the semiconductor or precursor thereof such as the liquid crystalline semiconductor 6-(4'-octylphenyl)-2-dodecyloxynaphthalene (often abbreviated as 8-PNP-O12). It is though preferred to provide the second semiconductor as a solute dissolved in a suitable solvent.

If the second semiconductor is deposited as a precursor, then the process includes a step of converting the precursor into the second semiconductor. This can be done typically by heating the deposited mixture including the precursor. Such a heating step is typically carried out at 100-150° C. for 1-30 minutes. This is below the sintering temperature of the first semiconductor. Possible precursors of the second semiconductor are a pentacene precursor or an $SnS_2$ precursor.

The suspension of the particles of the first semiconductor can be provided in the form of a colloidal suspension in a suitable liquid dispersant. This suspension can be deposited as a first step onto the surface of the substrate. The solution of the second semiconductor or precursor thereof is subsequently deposited onto the deposited suspension of the first semiconductor to form the mixture on the surface of the substrate. This step may be carried out by projection of the liquid phase comprising the second semiconductor, or precursor thereof, in the form of liquid droplets. It is preferred in this case that the deposited colloidal suspension of the particles of the first semiconductor is annealed at a temperature of 100-150° C. before depositing the liquid phase comprising the second semiconductor or precursor thereof.

As an alternative to the above, the particles of the first semiconductor may be dispersed in the solution of the second semiconductor, or precursor thereof, and the resulting mixture subsequently deposited on the surface of the substrate. Forming the mixture of the two semiconductors prior to their deposition is a preferred feature of the invention as only a single deposition step is then required. It does however depend upon being able to satisfactorily disperse the particles of the first semiconductor in the solution of the second semiconductor (or precursor thereof). In this case, the mixture can be deposited by any of spin-coating, doctor-blading or ink-jet printing.

In yet a further alternative, the second semiconductor or precursor thereof may be deposited by any of spin-coating, doctor-blading or ink-jet printing followed by the deposition thereon of the suspension of the first semiconductor. This subsequent deposition is preferably carried out by ink-jet printing.

It will thus be seen that the first semiconductor and the second semiconductor or precursor thereof may be deposited on the surface of the substrate in any order or even together as a preformed mixture. More particularly, the first semiconductor may be deposited first followed by the second semiconductor or precursor thereof; the second semiconductor or precursor thereof may be deposited first followed by the first semiconductor; or the first semiconductor and second semiconductor or precursor thereof may be pre-mixed to form a dispersion of the particles of the first semiconductor in a solution of the second and deposited together as a mixture.

In the above context, "the surface of the substrate" is not limited to the actual surface of for instance a plastic or glass substrate used in the production of a semiconductor element. Rather, "substrate" in this context is intended to encompass any material on which the semiconductor element is formed which includes surfaces already coated and/or patterned with conductors or semiconductors as part of the fabrication of electronic devices such as transistors.

According to a second aspect, the invention provides a semiconductor element comprising semiconductor particles in a matrix of a semiconductor binder which electrically connects adjacent semiconductor particles, wherein the binder and particles are of the same conductivity type, and the binder is formed from the same or a different material than that forming the particles.

As previously explained, arranging the particles of the first semiconductor in a matrix of the second semiconductor results in a semiconductor element having increased bulk conductance compared with that of an element formed from the particles alone. This is because the matrix formed from the second semiconductor electrically connects adjacent semiconductor particles which facilitates the passage of charge carriers between adjacent particles thus increasing their overall mobility in the element.

Preferably the volume ratio of semiconductor particles to the semiconductor binder is in the range 50:50-95:5. Such a volume ratio has a consequence that the majority of the element is formed from the semiconductor particles. As the particles typically have a higher intrinsic charge carrier mobility than that possessed by the semiconductor binder, it is ensured that the bulk charge carrier mobility of the element as a whole is relatively high.

The semiconductor particles in the semiconductor element can have a variety of shapes, both regular and irregular. Whatever the shape, each particle will have an axis corresponding to a longest dimension. It is preferred that the average of these longest dimensions of the semiconductor particles should fall in the range 0.01-5 μm.

The particles and the binder have the same conductivity type. If this is n-type, the semiconductor particles can be formed from cadmium selenide (CdSe), tin disulphide ($SnS_2$), molybdenum disulphide ($MoS_2$) or tungsten ditelluride ($WTe_2$). The semiconductor binder molecules may be formed from poly(benzamidazobenzo phenanthroline), methanofullerene [6,6]-phenyl $C_{61}$ butyric acid methyl ester or poly [2,3-di(p-tolyl)-quinoxaline-5,8-diyl].

Alternatively, both the particles and the binder may be p-type. In this case, the semiconductor particles can be formed from an organic semiconductor such as pentacene or hexabenzocoronene, and the binder may be a polythiophene.

It is preferred that the binder molecules, whether p-type or n-type, should have a conjugated bond structure such as that possessed by the p-type semiconductor polythiophene, a specific example of which is 3-hexylthiophene (P3HT) and the n-type semiconductor poly(benzimidazobenzo phenanthroline).

In the semiconductor element, the molecules of the second semiconductor may be linked to particles of the first semiconductor by anchoring groups or moieties. Such groups may anchor the second semiconductor to the particles by means of covalent bonding or some other molecular interaction such as by π-π* interaction or by Van der Waals interaction. Such linking of the binder to the particles has the advantage that it facilitates the transfer of charge carriers between the particles and the binder which in turn increases the bulk electrical conductance of the semiconductor element.

The semiconductor element according to the second aspect of the present invention may be used as a component of a thin film transistor. For instance, the semiconductor element may be a transistor channel in electrical contact with source and drain electrodes. Alternatively, the semiconductor element may be a component of an organic light emitting diode. Such thin film transistors or organic light emitting diodes are preferably incorporated in an electrical appliance.

Figure 2:
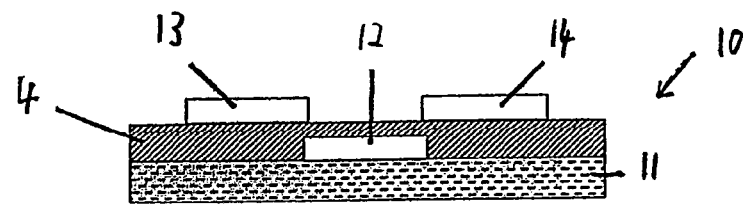
Figure 3:
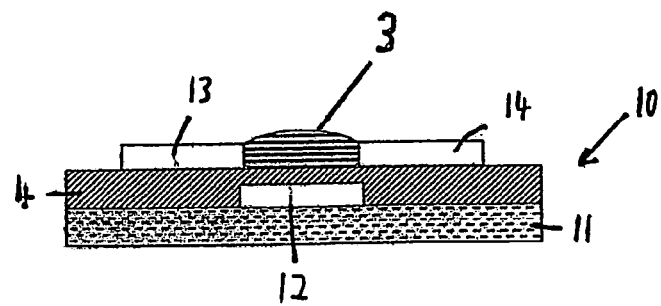
Figure 4:
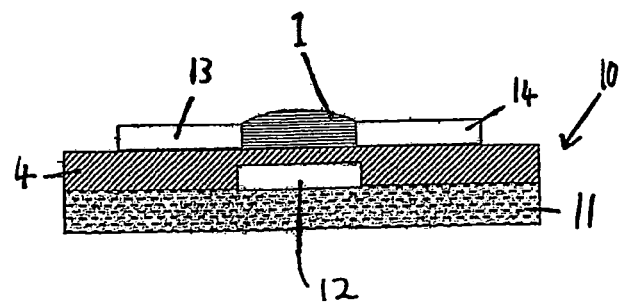

The present invention will now be described in greater detail which will include references to the accompanying drawings, in which like numerals are used throughout, and in which:

FIG. 1 diagrammatically illustrates an energy band diagram of an interface between poly(3-hexylthiophene) and pentacene;

FIG. 2 diagrammatically illustrates a cross-section through a partially fabricated thin film transistor lacking a semiconductor layer bridging the source and drain electrodes;

FIG. 3 corresponds to FIG. 2 in which a suspension of particles of a first semiconductor has been deposited bridging the source and drain electrodes; and FIG. 4 corresponds to FIG. 2 in which a semiconductor element has been formed bridging the source and drain electrodes.

According to its first aspect, the present invention provides a method of fabricating a semiconductor element, such as a film, which has a higher bulk electrical conductance than prior art films formed from solution-deposited semiconductors. The method comprises a first step of depositing a suspension of particles of a first semiconductor and a solution of a second semiconductor or a precursor thereof on a surface of a substrate. This results in there being a mixture on the surface which comprises particles of the first semiconductor suspended in a liquid phase comprising the second semiconductor or precursor thereof. In a second step, the mixture is solidified to form the semiconductor element comprising particles of the first semiconductor in a matrix of the second semiconductor which electrically connects adjacent particles of the first semiconductor.

The semiconductor element provided by the present invention comprises semiconductor particles in a matrix of a semiconductor binder which electrically connects adjacent semiconductor particles. The binder and particles are of the same conductivity type. Thus these materials are either both n-type or both p-type. The binder is formed from the same or a different material than that forming the particles. The semiconductor binder electrically connects adjacent particles of the first semiconductor increasing the mobility of charge carriers between the particles, as compared to there being no matrix, in which case there would be voids between the particles.

In the case of two semiconductor particles in close proximity to one another and electrically connected by several semiconductor matrix molecules, the bulk charge carrier mobility of the system is expected to approach the intrinsic charge carrier mobility of an individual semiconductor particle.

It is preferred that the first and second semiconductors are formed from different materials. In this case, the first semiconductor should have a higher intrinsic charge carrier mobility than the second semiconductor material. This is because the particles of the first semiconductor are largely responsible for the bulk charge carrier mobility of the semiconductor element.

The first semiconductor and second semiconductor may though be formed from identical materials. In this case, the second semiconductor is preferably provided in the form of its precursor when it is deposited on the surface of the substrate. After deposition, the precursor is converted by appropriate treatment into the second semiconductor being the same material as that forming the first semiconductor. This conversion may be carried out by heating the deposited precursor at 100-200° C. for 1-30 minutes. Possible precursors which can be used include a pentacene precursor or an $SnS_2$ precursor.

The second semiconductor is deposited as a solution either by heating it above its melting point or by first dissolving it in a suitable solvent. Typical useful solvents include toluene, chloroform and chlorobenzene. The second semiconductor is deposited in liquid form. This liquid mixes with the suspension of the particles of the first semiconductor after they have both been deposited on the substrate surface and the resulting mixture is then solidified by either cooling if the second semiconductor has been heated above its melting point, or more typically by evaporating the solvent and dispersant that facilitated the deposition of the two semiconductors.

In the present invention, the matrix of the second semiconductor may be amorphous or formed from relatively small particles compared to the size of the particles of the first semiconductor. If the second semiconductor is particulate, then the average size of its particles is 1-100 nm, more preferably 1-10 nm.

The particles of the first semiconductor may be deposited as a colloidal suspension in a liquid phase (dispersant) onto the substrate surface. The dispersant may for instance be water or an organic liquid such as 1,3,5-mesitylene.

The suspension of the particles of the first semiconductor may be deposited by a coating technique such as spin-coating, pad-printing, doctor-blading, screen printing, flexo printing, offset printing or projection in the form of liquid droplets (sometimes known as "ink-jet printing"). The use of doctor-blading or ink-jet printing allows the colloidal semiconductor to be deposited quickly, accurately in the desired area (or areas) and relatively cheaply.

Spin-coating may also be used to deposit the suspension of particles of the first semiconductor if this is deposited before the solution of the second semiconductor. If the semiconductor particles have an elongate shape, then spin-coating causes the particles to be flow-aligned during deposition. This can in turn increase the packing density of the particles which is advantageous as a higher packing density leads to the semiconductor element having a higher bulk electrical conductance. More particularly, such flow alignment of the semiconductor particles in the dispersant results in an effective increase in the average particle length in a plane parallel to the plane of the substrate surface and therefore also in an increase in the overall intrinsic charge carrier mobility.

After the suspension of particles of the first semiconductor has been deposited, then the suspension is preferably annealed at a temperature of 100-150° C. before depositing the solution of the second semiconductor or precursor thereof. Such an annealing step has the advantage of removing any capping layer which may surround the particles.

The second semiconductor or precursor thereof may be deposited onto the suspension of the particles of the first semiconductor after the latter's deposition. This can be done, for instance, by dissolving the second semiconductor in a solvent and projecting the resulting solution onto the previously deposited suspension in the form of liquid droplets. The use of ink-jet printing to deposit the solution of the second semiconductor onto the previously deposited suspension of the semiconductor particles allows the second semiconductor to be deposited quickly, accurately and relatively cheaply. Ink-jet printing is also advantageous insofar as the deposition apparatus does not directly contact the previously deposited suspension of the first semiconductor and therefore does not disadvantageously disturb it.

It is also possible to deposit the solution of the second semiconductor, or precursor thereof, on the substrate before depositing the suspension of the first semiconductor. This deposition can be performed for instance by doctor-blading, pad-printing, spin-coating or ink-jet printing. Subsequently, the suspension of particles of the first semiconductor is then printed onto the second semiconductor by for instance ink-jet printing. Ink-jet printing the suspension of particles of the first semiconductor has the advantages that it can be carried out relatively quickly and accurately and also without the need for any of the deposition apparatus to directly contact, and thereby disadvantageously disturb, the previously deposited solution of the second semiconductor or precursor thereof.

Alternatively, the solution of the second semiconductor or precursor thereof may be mixed with the colloidal semiconductor, either as a suspension or as solid particles, before their joint deposition on the substrate. This allows deposition of the first and second semiconductors to be carried out in a single step which improves processing efficiency. In this case, the solvent in which the second semiconductor is typically dissolved can also act as the dispersant for the particles of the first semiconductor. The mixture may be deposited for instance by doctor-blading, pad-printing, spin-coating or ink-jet printing.

The volume ratio of the particles of the first semiconductor to the matrix of the second semiconductor in the semiconductor element preferably lies in the range 50:50-95:5. A ratio above 50:50 is desirable because the particles of the first semiconductor tend to have a higher intrinsic conductivity than the matrix formed from the second semiconductor. Whilst a relatively high volume ratio approaching 95% for the semiconductor particles is desirable, achieving this is dependent upon the shape of the particles. For example, particles in the shape of flakes may be packed much more tightly than particles which are roughly spherical and so require less matrix material to fill the voids between the particles. Preferably, the volume ratio of particles of the first semiconductor to the matrix of the second semiconductor is 70:30-95:5, most preferably 80:20-95:5.

The particles of the first semiconductor may be generally spherical in shape although this is not so preferred as it does not permit high packing densities to be achieved. It is more preferred that the particles are in the shape of flakes, platelets or nanotubes as such shapes can achieve relatively high packing densities resulting in a semiconductor element having higher bulk electrical conductance compared to a semiconductor element comprising generally spherically shaped particles. Both pentacene and $SnS_2$ may be formed into platelet crystals which is the preferred particle shape for the first semiconductor.

The average of the longest dimension of the particles of the first semiconductor is preferably 0.01-5 μm, more preferably 0.03-2 μm and most preferably 0.05-0.5 μm. The average of the shortest dimension of the particles of the first semiconductor is preferably no greater than 0.1 μm and more preferably not greater than 0.01 μm. The ideal size of the particles of the first semiconductor is to some extent a compromise. Relatively small particles tend to be easier to process and facilitate device reproducibility. On the other hand, relatively large particles have greater bulk electrical conductance than relatively small particles because for a given distance the charge carriers pass through fewer grain boundaries. If the suspension of particles of the first semiconductor is deposited by ink-jet printing, then the largest particle size should not exceed 5 μm otherwise the particles tend to block the ink-jet print heads. It should be noted that the size and shape of the particles of the first semiconductor in the suspension to be deposited do not change in the final semiconductor element.

Commercially available semiconductor particles often come surrounded by a capping layer. Such a layer is used to control the size distribution of the particles during their growth. For instance, cadmium selenide particles are often synthesized surrounded by a capping layer typically of pyridine. These capping residues need to be removed at some stage. This can be done by subjecting the semiconductor particles to a low temperature annealing step in the range 100-150° C. either before or after deposition.

The conductivity type of the semiconductor particles and semiconductor matrix are both the same. If they are n-type, then the semiconductor particles may be formed for example from cadmium selenide or tin (IV) sulphide ($SnS_2$) and the semiconductor matrix may be formed from poly(benzamidazobenzo phenanthroline), methanofullerene [6,6]-phenyl $C_{61}$ butyric acid methyl ester or poly[2,3-di(p-tolyl)-quinoxaline-5,8-diyl]. For instance, semiconductor particles of cadmium selenide may be embedded in a matrix of poly(benzamidazobenzo phenanthroline). The latter includes nitrogen-containing heterocycles in which the lone pair of the nitrogen atom can form dative bonds with cadmium cations if the semiconductor particles are formed from cadmium selenide. The conjugated bond structure of the poly(benzamidazobenzo phenanthroline) can electrically bridge the semiconductor particles of cadmium selenide which is effective to increase the bulk electrical conductance of the semiconductor element compared to a semiconductor element formed only from the cadmium selenide particles, i.e. not embedded in any semiconducting matrix.

Alternatively, the conductivity type of the semiconductor particles and the semiconductor matrix may be p-type. In this case, the semiconductor particles may be an organic semiconductor, such as pentacene or hexabenzocoronene. The p-type semiconductor forming the matrix preferably includes a conjugated bond structure. The presence of such conjugated structures allows electrons to be easily transferred along the length of the molecule and hence in turn between adjacent particles of the first semiconductor. An example of such a conjugated binder is a polythiophene such as poly(3-hexylthiophene)(P3HT) whose formula is:

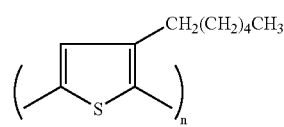

wherein n is an integer of 100-1000.

Alternatively, such conjugated bond structures may even be provided by groups of atoms with metal d-orbital-derived bonds such as in the metal organic ruthenium-bipyridyl complexes that are used for the dye-sensitization of nanocrystalline $TiO_2$ electrodes in photovoltaic cells, or completely inorganic metal complexes.

The second semiconductor preferably forms links to semiconductor particles via anchoring groups or moieties which interact or even covalently bond the ends of the binder molecules to adjacent semiconductor particles. Such groups for instance include carboxyl groups, phosphate groups, amine groups, hydroxamate groups, thiol groups and aromatic rings with electron accepting substituents. For instance if the semiconductor particles are formed from cadmium selenide, then the semiconductor forming the matrix preferably includes nitrogen heterocycles at the ends of its polymer chain as these are able to form dative bonds with cadmium cations. The P3HT can interact with pentacene particles via Van der Waals interactions to link this conjugated binder to the pentacene particles.

On the other hand, if the semiconductor particles are formed from pentacene or hexabenzocoronene, a polythiophene such as P3HT can be end-capped with phenyl rings bearing one or more electron accepting substituents or a perylene diimide moiety whose structure is:

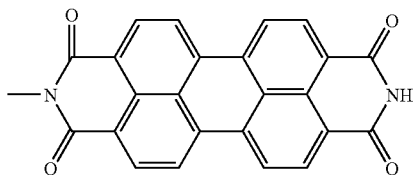

Such cyclic structures are capable of bonding to particles of p-type organic semiconductors by means of π-π* interactions.

The use of molecules that possess anchoring groups as the second semiconductor may effectively result in a dipole layer being formed at the interface between the semiconductor particles and semiconductor matrix molecules. Depending on the orientation of the dipole layer, it may reduce the offset between the respective conduction bands or the offset between the respective valence bands. The reduced offsets result in an electrical contact between the semiconductor particles and semiconductor matrix molecules that behaves more ohmically.

If the first and second semiconductors are selected such that there is some form of linking between them, such as bonding, then it is probable that they will need to be deposited separately onto the substrate. Otherwise if they are mixed before deposition, then the first and second semiconductors could interact prematurely before formation of the particle/matrix semiconductor element which is likely to be disadvantageous.

Turning now to the accompanying drawings, FIG. 1 illustrates energy bands for a poly(3-hexylthiophene) semiconductor binder and a pentacene semiconductor particle. This illustrates one important criterion for the selection of the first and second semiconducting materials which respectively form the particles and matrix. More particularly, in the case of p-type semiconductor particles and matrix, the highest energy level of the valence band of the semiconductor binder molecule should be closely aligned to the highest energy level of the valence band of the semiconductor particle. This requirement is fulfilled for the combination of for example pentacene semiconductor particles and P3HT as the semiconductor binder molecules. Both these materials have ionisatiion potentials of approximately 5.0 eV as determined by ultraviolet photoelectron spectroscopy (UPS). Consequently, there is no energy barrier that hinders the movement of holes across the interface between the particles and matrix.

Conversely, in the case of n-type semiconductor binder matrix and particles, it is desirable that the lowest energy level of the conduction band of the second semiconductor forming the matrix should be closely aligned to the lowest energy level of the conduction band of the first semiconductor forming the particles.

FIG. 2 illustrates a plurality of components of a thin film transistor, shown generally as 10, provided on a substrate 11. Overlying the substrate 11 is a dielectric layer 4 and a gate electrode 12. Overlying the dielectric layer 4, there is a source electrode 13 and a drain electrode 14. This plurality of components corresponds to the "substrate" within the meaning of this term as used in this specification.

FIG. 3 shows the same components of a thin film transistor 10 shown in FIG. 2 in which a suspension 3 of particles of a first semiconductor has been deposited by, for instance, spin-coating or ink-jet printing, between the source electrode 13 and the drain electrode 14. If a capping layer is present on the semiconductor particles, an annealing step is carried out at about 125° C. to desorb the capping material.

Referring to FIG. 4, semiconductor molecules for forming the matrix dissolved in a suitable solvent have been ink-jet printed onto the suspension of the semiconductor particles. The mixture comprising the particles of the first semiconductor suspended in a liquid phase comprising the second semiconductor is then solidified to form the semiconductor element 1. Preferably the solidification is carried out by heating the mixture for 1-30 minutes at 40-150° C., more preferably for 2-20 minutes at 80-130° C. During this step, the solvent in which the second semiconductor is dissolved and/or the dispersant in which the particles of the first semiconductor are dispersed are evaporated away. If the second semiconductor is provided in the form of a precursor thereof, this solidification step may need to be carried out at a higher temperature of up to 200° C. in order both to convert the precursor into the second semiconductor whilst at the same time solidifying the mixture. The molecules of the second semiconductor form a matrix around the semiconductor particles electrically connecting them to increase the bulk electrical conductance of the element as a whole.

The substrate on which the semiconductor element of the invention is formed may include a plurality of components of a thin film transistor, including a gate electrode, a dielectric layer, a source electrode and drain electrode. An element, such as a film, formed according to the invention is particularly suited for forming one or more components of a thin film transistor. Particularly, the semiconductor element may be formed so as to be in electrical contact with the source electrode and the drain electrode of a thin film transistor.

An electrical appliance may include a thin film transistor having included therein an element in the form of a film formed in accordance with the invention. Thin film transistors including a semiconducting film according to the invention are particularly suited for use in displays and other electrical appliances. The semiconducting element according to the second aspect of the present invention may for instance also be a transistor channel.

Alternatively, the semiconductor element of the invention may be included in an organic light emitting diode. This diode may in turn be included in an electrical appliance.

Four examples of film fabrication methods according to the present invention will now be described. However, it will be understood that other methods of fabrication within the scope of the invention are possible.

EXAMPLE 1 p-Type Semiconductors Deposited as a Mixture (1) Pentacene Particle Suspension in Mesitylene 2.0 g of pentacene were dispersed in 50 ml of mesitylene. The dispersion was then milled in a planetary ball mill for 4 hours under an inert gas atmosphere in a glove box.

(2) Pentacene Precursor Solution in Chloroform 0.5 g of pentacene, 0.6 g of N-sulfinylacetamide and 0.005 g of methyltrioxorhenium were added to 30 ml of chloroform and refluxed for 2 days. The resulting pentacene precursor product was purified by flash chromatography.

Equal amounts of the pentacene suspension (1) and the pentacene precursor solution (2) were mixed under an inert gas atmosphere to form an ink formulation. The resulting ink formulation contained approximately 25 mg pentacene particles/ml and 6.3 mg pentacene in precursor form/ml, corresponding to a volume ratio of 80:20 pentacene particles/precursor derived pentacene.

The combined particle-precursor ink was spin-coated at 2000 rpm for 60-seconds in a glove box onto a substrate bearing pre-prepared, partially fabricated thin film transistors (10) that lacked the semiconductor layer bridging the source and drain electrodes (13, 14). This resulted in a film containing pentacene particles in a pentacene precursor matrix.

The pentacene precursor matrix was then converted into pentacene by heating to 160° C. for about 2 minutes under an inert gas atmosphere. This annealing process resulted in the formation of a polycrystalline pentacene film with (the original) larger pentacene particles being embedded in a matrix of smaller, precursor-derived pentacene crystallites.

EXAMPLE 2 p-Type Semiconductors Deposited as a Mixture (3) P3HT Solution in Chloroform 0.5 g of P3HT was dissolved in 50 ml of chloroform by stirring overnight under an inert atmosphere in a glove box.

Equal amounts of the pentacene suspension (1) formed in Example 1 and of the P3HT solution in chloroform (3) were mixed under an inert gas atmosphere. The resulting ink formulation contained 20 mg pentacene particles/ml and 5 mg P3HT/ml, corresponding to a volume ratio of approximately 75:25 pentacene particles/P3HT (specific density of pentacene 1.2 g/cm$^3$; specific density of P3HT 1.1 g/cm$^3$). This ink was then spin-coated at 2000 rpm for 60 seconds onto a substrate bearing pre-prepared, partially fabricated thin film transistors (10) that lacked the semiconductor layer bridging the source and drain electrodes (13, 14) such as illustrated in FIG. 2. The residual solvent was then removed by annealing to 100° C. for 2 minutes under an inert gas atmosphere. This resulted in the formation of a semiconductor film containing pentacene particles embedded in a matrix of P3HT.

EXAMPLE 3 n-Type Semiconductors Deposited as a Mixture (4) $SnS_2$ Particle Suspension in Water $SnS_2$ powder obtained from a commercial source (Strem) was subjected to an intercalation reaction under nitrogen with butyl-lithium (1.6M in anhydrous hexane, Aldrich), which was added slowly to a few hundred milligrams of $SnS_2$ powder, at an excess of 3 moles of BuLi to every mole of $SnS_2$. The mixture was then topped up with anhydrous hexane and left under nitrogen for four days to allow the lithium to diffuse into the Van der Waals gaps of the $SnS_2$.

20 mg of the Li-intercalated $SnS_2$ were then exfoliated in 20 ml of water (Millipore, 18MΩ/cm) in an ultrasonic bath for 1 hour. The ultrasonic bath was used to thoroughly agitate the suspension and to ensure good exfoliation. The suspension was then centrifuged and washed in water 3 times to pH 7 (in order to remove LiOH and hexane) and finally dispersed in 2 ml water.

(5) $SnS_2$ Precursor Solution in Hydrazine 20 mg of $SnS_2$ powder obtained from a commercial source (Strem) and 4 mg sulphur were added to 2 ml of freshly distilled hydrazine. The solid reactants were completely dissolved after stirring at room temperature in a nitrogen-filled phial for 6 hours.

Equal amounts of the $SnS_2$ particle suspension in water (4) and of the $SnS_2$ precursor solution in hydrazine (5) were mixed under an inert gas atmosphere. The resulting ink formulation contained approximately 10 mg $SnS_2$ particles/ml and 10 mg $SnS_2$ in precursor form/ml, corresponding to a volume ratio of 50:50 $SnS_2$ particles/precursor derived $SnS_2$.

The combined particle-precursor ink was spin-coated at 2000 rpm for 60 seconds onto a substrate with pre-prepared, partially fabricated thin film transistors (10) which lack the semiconductor layer bridging the source and drain electrodes (13, 14) such as illustrated in FIG. 2. This resulted in a mixture comprising $SnS_2$ particles surrounded by the $SnS_2$ precursor being deposited between the source and drain-electrodes.

The $SnS_2$ precursor was then converted into $SnS_2$ by first heating to 120° C. for 5 minutes in an inert gas atmosphere. Then, the film was annealed at 295° C. for 20 minutes. The annealing process resulted in the formation of a polycrystalline $SnS_2$ film with (the original) larger particles being embedded in a matrix of smaller, precursor-derived $SnS_2$ crystallites.

EXAMPLE 4 n-Type Semiconductors Deposited Separately

Methanofullerene [6,6]-phenyl $C_{61}$ butyric acid methyl ester was dissolved in chlorobenzene at a concentration of 20 g/l. This solution was then spin-coated at 2000 rpm for 60 seconds onto a substrate with pre-prepared, partially fabricated thin film transistors (10) which lack the semiconductor layer bridging the source and drain electrodes (13, 14) such as illustrated in FIG. 2. The resulting spin-coated solution had a thickness of 50 nm.

The $SnS_2$ particle suspension (4) as formed in Example 3 was then ink-jet printed onto the previously deposited film. The resulting film was then dried to 120° C. for 20 minutes to evaporate away the solvents resulting in the formation of a semiconductor film formed from particles of $SnS_2$ embedded in a matrix of the fullerene.

The invention claimed is:

1. A method of forming an organic semiconductor element having a gate electrode, a source electrode and a drain electrode, the method comprising:

applying a first liquid material to a portion between the source electrode and the drain electrode, the first liquid material including a plurality of particles formed from a first organic semiconductor, the particles being covered with a capped material;

removing the capping material that covers the plurality of particles by heating at a temperature of 100-150° C.;

applying to the portion a solution of a second organic semiconductor, the first and second organic semiconductors being different materials, the second organic semiconductor having a lower intrinsic charge carrier mobility than the first organic semiconductor; and solidifying a resulting mixture including the particles formed from the first organic semiconductor and the solution to form a semiconductor film comprising particles of the first organic semiconductor in a matrix of the second organic semiconductor in which:

(i) the volume ratio of the particles of the first organic semiconductor to the matrix of the second organic semiconductor is in the range 50:50-95:5; and (ii) the molecules of the second organic semiconductor are bonded to the particles of the first organic semiconductor by means $\pi$-$\pi$* interactions.

2. The method according to claim 1, wherein the first organic semiconductor is a pentacene.

3. The method according to claim 1, wherein the first organic semiconductor is a hexabenzocoronene.

4. The method according to claim 1, wherein the second organic semiconductor comprises a molecule end-capped with a phenyl ring bearing one or more electrons accepting substituents.

5. The method according to claim 1, wherein the second organic semiconductor comprises a molecule end-capped with a perylene diimide moiety.

6. The method according to claim 1, wherein the second organic semiconductor is a polythiophene.

7. The method according to claim 6, wherein the second organic semiconductor is a poly(3-hexylthiophene).

8. The method according to claim 1, wherein the first liquid material is applied by ink-jet printing.

9. The method according to claim 1, wherein the solution of the second organic semiconductor is applied by ink-jet printing.

10. The method according to claim 1, wherein the source and drain electrodes are formed on an insulating layer, the insulating layer is formed over the gate electrode, and the gate electrode is formed over a substrate that is made from a plastic material.

11. The method according to claim 1, wherein the resulting mixture of the first liquid material and the solution is solidified by heating.

* * * * *